United States Patent [19]

DellaGuardia et al.

[11] Patent Number: 5,264,328

[45] Date of Patent: Nov. 23, 1993

[54] RESIST DEVELOPMENT ENDPOINT DETECTION FOR X-RAY LITHOGRAPHY

[75] Inventors: Ronald A. DellaGuardia, Poughkeepsie, N.Y.; John L. Mauer, IV, South Kent, Conn.; David E. Seeger, Congers, N.Y.

[73] Assignee: International Business Machines Corporation, Armonk, N.Y.

[21] Appl. No.: 874,286

[22] Filed: Apr. 24, 1992

[51] Int. Cl.$^5$ .............................................. G03C 5/02
[52] U.S. Cl. ..................................... 430/322; 378/35; 427/160; 427/258; 427/259; 430/270; 430/967
[58] Field of Search .................. 430/5, 967, 270, 322; 378/35; 427/160, 258, 259

[56] References Cited

U.S. PATENT DOCUMENTS

| | | |
|---|---|---|
| 4,035,522 | 7/1977 | Hatzakis .............................. 430/967 |
| 4,039,370 | 8/1977 | Kleinknecht . |
| 4,142,107 | 2/1979 | Hatzakis et al. . |
| 4,179,622 | 12/1979 | Moritz . |
| 4,198,261 | 4/1980 | Busta et al. . |
| 4,201,579 | 5/1980 | Robinson et al. . |
| 4,303,341 | 12/1981 | Kleinknecht . |
| 4,377,436 | 3/1983 | Donnelly et al. . |
| 4,403,150 | 9/1983 | Kurihara et al. . |
| 4,482,424 | 11/1984 | Katzir et al. . |
| 4,496,425 | 1/1985 | Kuyel . |
| 4,512,847 | 4/1985 | Brunsch et al. . |
| 4,536,882 | 8/1985 | Jones et al. ............................ 430/5 |
| 4,543,319 | 9/1985 | Chao et al. .......................... 430/967 |
| 4,569,717 | 2/1986 | Ohgami et al. . |
| 4,587,184 | 5/1986 | Schneider-Gmelch et al. . |
| 4,613,754 | 9/1986 | Vinegar et al. . |
| 4,621,037 | 11/1986 | Kanda et al. ........................ 430/967 |
| 4,692,934 | 9/1987 | Forsyth . |
| 4,717,446 | 1/1988 | Nagy et al. . |
| 4,725,332 | 2/1988 | Spohr . |
| 4,898,471 | 2/1990 | Stonestrom et al. . |
| 4,998,021 | 3/1991 | Mimasaka . |

OTHER PUBLICATIONS

D. Hofer et al., "X-Ray Lithographic Patterning of Magnetic Bubble Circuits with Submicron Dimensions", Proc. 15th Sym. on Elec., Ion and Photon Beam Tech., Boston, Mass., May 1979.

A. Wagner et al., "X-Ray Mask Repair with Focused Ion Beams", J.Vac.Sci.Technol. B8(6), Nov./Dec. 1990, pp. 1557-1564.

Primary Examiner—John Kight, III
Assistant Examiner—John M. Cooney, Jr.
Attorney, Agent, or Firm—Louis J. Percello

[57] ABSTRACT

The present invention provides a method for determining the development endpoint in a X-ray lithographic process. Endpoint is determined by visually observing resist test field patterns through a microscope during the developing step. During the developing, changing test field patterns are formed because test field locations each had been exposed simultaneously to different radiation doses. These different doses are produced when radiation passes through a mask containing a plurality of different size radiation attenuators. When the changing test field pattern matches a known pattern, which is correlated to the desired development endpoint, the workpiece is removed from the developing step.

18 Claims, 4 Drawing Sheets

RESIST DEVELOPMENT ENDPOINT DETECTION FOR X-RAY LITHOGRAPHY

BACKGROUND OF THE INVENTION

1. Field of the Invention

This invention relates to the field of X-ray lithography. More particularly, this invention relates to a method for determining the development endpoint of an X-ray exposed resist by optically inspecting a test area while the resist develops.

2. Description of the Prior Art

Lithography is a process which creates patterns in a coating material after it has been applied on a surface. The coating material applied to the substrate is sometimes called a resist. During the process, selected portions of the resist are exposed to radiation. The radiation changes some property of the exposed portions of the resist. This change is later exploited in a developing step to create patterns of resist on the substrate by selectively removing portions of the resist from the substrate.

As an example, resists are typically sensitive to types of radiation energy, such as light, E beam, or X-rays. Exposure to this radiation can make selected areas of the resist more or less soluable in a certain type of solution called a developer. Patterns of resist are created on a substrate when more soluable parts of the exposed resist are dissolved from the substrate by the developing solution. This is the kind of process used to develop photographic film after it has been exposed to light in a camera.

Some lithographic processes, for instance those used in the manufacturing of electronic circuitry, pass radiation through a mask to selectively expose a resist. Portions of the mask permit radiation to pass through to expose some portions of the resist. Other portions of the mask prevent all or substantially all radiation from impinging on other portions of the resist. Consequently, due to the mask, some selected portions of the resist are exposed to more radiation (receive a higher dose) than other portions of the resist.

A developing step exploits the difference in properties between the irradiated and the unirradiated portions of the resist. Resist patterns, comprised of lines, are created when the developer (or developing step) removes selected parts of the resist from the substrate. For this description, lines of resist are defined as individual portions of resist which remain on the substrate after the lithographic process is complete.

During the developing step, a developer will remove, or etch, certain portions of the resist from the substrate faster than other portions. This selective removal during development results from the selective irradiation of the resist, i.e., different resist portions receiving radiation doses. The selective removal creates the resist pattern on the substrate.

Endpoint detection is a method for determining when to stop the developing process. The time chosen to stop the developing is called the development endpoint or endpoint. Endpoint detection is a critical determination in many lithographic processes. If the developing is stopped too early, the resist will not be removed, or cleared, from the substrate and therefore no pattern will be formed. In the other extreme, if the developing process is stopped too late, all the resist could be removed, or cleared, from the substrate, completely exposing a bare substrate so that no pattern remains.

Endpoint detection also effects the creation of the lines which form the resist pattern and appear like "hills or cliffs" on the substrate with cleared areas between the lines. Lines are formed during the developing step as the most soluable or easily developed portions of the resist clear from the substrate and the less soluable or harder-to-develop resist remains on the substrate. During development, the point in time when the first region on the substrate is exposed, i.e., is cleared, is called the first clear point. At this first clear point, the lines have a certain width. As the developing continues in time past the first clear point and the lines themselves are gradually removed, the linewidth changes, i.e. the lines become narrower. Poor endpoint detection can cause problems in creating the proper width of pattern lines, i.e., linewidth.

Endpoint detection is particularly critical if producing resist linewidths of a precise dimension is important as in the production of submicron linewidths on electronic circuitry. Choosing an endpoint too soon creates linewidths too wide and choosing an endpoint too late creates linewidths too narrow.

The prior art has many ways to detect endpoint development or resist clearing in lithography. These methods include: monitoring light reflected or diffracted from a test region; using optical interferometric techniques; looking for changes related to material properties (fluorescence or luminescence); detecting substrate reaction products in an etching plasma; and monitoring separate test samples undergoing the same development process as the original workpiece.

Some prior art uses reflection of light from a test region to detect development endpoint. U.S. Pat. No. 4,496,425 discloses an etched fresnel zone on an aluminum layer. Intensity of light reflected from the fresnel zone during plasma etching is monitored and the etching process terminates when the intensity falls below a predetermined level.

Some prior art uses diffraction of light from a test pattern to determine endpoint. (Diffraction is a change which light undergoes when it passes by the edges of opaque bodies or through narrow slits.) U.S. Pat. No. 4,142,107 discloses a visual inspection and automatic endpoint detection of residual photoresist. By exposing a test area to two different radiation levels, different patterns of exposure are created on the test area. During development, the more exposed areas develop faster forming the remaining resist into a changing, light diffracting, optical grating pattern on the test area. Endpoint is reached when the resist clears the test area.

Automatic endpoint detection is possible by monitoring light diffracting off the changing optical grating pattern. This method can be used with ultraviolet, X-ray and E beam exposure systems. U.S. Pat. Nos. 4,303,341 and 4,039,370 disclose exposing a diffraction grating pattern to light and monitoring intensity or ratios of intensities to determine undercutting of a layer or pattern dimensions. Similarly, U.S. Pat. No. 4,179,622 teaches exposing an optical grid pattern on a photoresist layer, directing a light ray on to the grid pattern, and looking for an intensity minimum of the 2nd diffraction order to indicate the end of the development process.

Optical interferometric techniques are also used to detect endpoints. For example, U.S. Pat. No. 4,998,021 discloses projecting of coherent light onto an upper surface layer and receiving superposed light caused by the interference of light reflected from two surfaces of the layer. Endpoint is determined by monitoring variations in the sampled light interference data.

As U.S. Pat. No. 4,717,446 states, there are many variations on this method including looking for sharp changes in signal slope, oscillation frequency, or level detected. However, many of these methods are difficult to use and prone to error. In particular, these methods produce error in X-ray lithography because X-ray radiation on a local scale is not uniform. This nonuniformity causes surface roughness during developing which in turn causes light to be reflected unpredictably.

Prior art exists which uses properties like fluorescence or luminescence to detect endpoint. U.S. Pat. No. 4,482,424, discloses doping (physically mixing) the resist with a fluorescent material. The monitored fluorescence intensity decreases as the resist is removed from the substrate. U.S. Pat. No. 4,377,436, discloses monitoring the luminescence associated with a reaction product of plasma etching in the immediate vicinity of etching.

Mixing additives in the resist material, as these methods do, often changes critical resist properties. Changes in the resist can result in many later process problems including: poor line width definition, nonvertical resist walls, and resist insolubility.

Some prior art discloses endpoint detection of plasma etching by monitoring changes in energy emissions from the plasma. (Plasma etching is a type of development process.) U.S. Pat. No. 4,482,424 describes a mass spectrometric analysis of the etching plasma that detects substrate reaction products which indicate that the substrate has been reached. Detection time delays cause inaccuracies in these methods. They also are not used in wet chemical developing.

Other prior art discusses monitoring a separate test sample to determine endpoint in an original workpiece. In U.S. Pat. No. 4,512,847, a test sample has the same material or structure as a workpiece but the sample has a wedge with an angle pointing toward the surface being removed. As the sample and workpiece are simultaneously exposed to the same subtractive process, the exposed gap between the walls of the wedge widens in the sample. A relationship exists between the gap size and material removed. U.S. Pat. No. 4,717,446 relates to the etch endpoint detection of epitaxially grown silicon using a separate monitor wafer, i.e., a second test sample.

These methods, which require a second test sample to determine endpoint, inspect the second sample to determine endpoint rather than the workpiece on which the desired resist pattern is produced. These methods are not as accurate as using in situ test samples (those on the original workpiece) because in situ test samples are more likely than remote test samples to experience the same process conditions as the original workpiece.

2. Statement of Problems With the Prior Art

Most of the prior art methods for detecting endpoint are relatively inaccurate, complicated, and subject to human interpretation. Some prior art results vary with changing process variables. Some prior art includes additives in the resist and/or uses a second comparable workpiece to determine endpoint. Most prior art does not teach how to predict multiple endpoints nor does it teach how to produce linewidths within tighter tolerances.

Optical interferometric techniques are difficult to use and prone to error. These techniques also require complicated monitoring equipment. Endpoint is often determined by operator judgement and its detection therefore is very dependent on operator skill, perception, and fatigue.

Prior art methods that etch diffraction pattern test fields on the resist, perform adequately to a point, however, these methods require sophisticated equipment to monitor light diffraction. Many of these methods are also subject to operator judgment.

Some disclosures required more than one irradiation of the wafer. Using only one irradiation of the workpiece saves time and is more efficient. Also, using one irradiation eliminates the possibility of unwanted dose level variations in subsequent irradiations.

Methods using fluorescence, luminescense, or measurement of some property change in a plasma require either additives to the resist or some etching of the substrate layer.

Most known methods involving reflection and diffraction patterns and most endpoint detection techniques using a single workpiece only predict an endpoint when the resist first clears from a substrate. These methods do not indicate how far the linewidth developing has progressed at each point in the developing process. Therefore, these methods predict linewidth only at one point in the development, usually the linewidth corresponding to the first clear of the resist.

Because most of this prior art does not teach how to accurately predict more than one development endpoint, there is no teaching about how to produce the resist linewidths that correspond to the many different endpoints which occur before or after reaching the only development endpoint predicted. An example illustrates how endpoint detection, limited to one endpoint, affects linewidth production. If the endpoint detection method predicts a development endpoint before the desired linewidth is reached, either the developing agent will not have yet cleared the resist from the substrate or the agent will not have laterally developed the resist long enough to produce the required linewidth. (Lateral thinning from developing occurs when the developing process removes resist from the side walls of the resist line.) On the other hand, if the endpoint is predicted after the desired linewidth is achieved, the linewidth will be degraded by too much lateral etching. (Wet bath etching degrades line width by excessive lateral etching of the resist walls. Ion etching methods degrade linewidth by excessive lateral etching and sputtering substrate deposits on the walls of the patterned resist.)

Furthermore, the prior art, known by the applicants, does not disclose any method to tighten line width tolerances. Tolerances designate the lowest and highest linewidth dimensions that are acceptable in the pattern formed on the substrate. To decrease the tolerances around a target linewidth, an endpoint detection method needs to be able to predict, as the resist develops, finer gradations of linewidth above and below the target linewidth. Most art teaches how to determine only one endpoint and therefore does not disclose how to determine gradations of linewidth during the developing step.

As desired linewidths become narrower, choosing the development endpoint for the desired linewidth tolerances becomes more difficult. This loss of linewidth control becomes particularly significant if pattern feature sizes are a few micrometers or smaller. A given amount of linewidth deviation will cause a greater percentage error when associated with a narrow line than the same given amount of deviation will cause when associated with a wider line.

To achieve increased circuit densities, newer integrated circuits and masks need patterns that have very narrower linewidths and lines within tighter dimensional tolerances. Producing these narrow widths precisely, requires more accurate and cost effective endpoint detection methods. This is particularly true with linewidths produced using higher energy radiation like X-rays. These linewidths are narrower than 1 micron (less than one millionth of a meter) and are currently undetectable by simple, cost effective methods.

Most of the prior art can only detect endpoints of linewidths on the order of 3 microns. Using the prior art to produce linewidths much smaller than this becomes very time consuming. Often the workpiece has to be removed from the developing process and observed under a Scanning Electron Microscope (SEM).

OBJECTIVES

An objective of this invention is to provide an improved method for detecting development endpoint in a lithographic process that produces submicron linewidths.

An additional objective of this invention is to provide an efficient, quick, and accurate determination of endpoint development of submicron linewidths in X-ray lithography using only an optical observation.

An additional objective of this invention is to provide an in situ method of endpoint detection for X-ray lithography which is independent of nonuniformities in radiation dose, material composition, resist additives, or developing agent.

A further objective of this invention is to provide a method of development endpoint detection for X-ray lithography which, during the developing step, predicts multiple linewidths by correlating each linewidth to a specific, objectively determinable endpoint.

A further objective of this invention is to provide a method of development endpoint detection for X-ray lithography which can predict line widths within very tight tolerances.

SUMMARY OF THE INVENTION

This invention is an efficient, accurate method for optically detecting endpoint in X-ray lithographic processes which create submicron linewidths in a resist.

In these processes, X-ray radiation passes through a mask to expose selected unmasked portions of an X-ray sensitive resist to a full dose of the radiation. The mask shields other portions of the resist from all or substantially all radiation exposure. The X-ray also simultaneously exposes a small test field on the resist.

A mask test area is created by placing one or more radiation attenuators on the mask in the selected mask test area. An attenuator on the mask creates a "shadow" on the resist where the radiation impinges on the resist after passing through the attenuator. The attenuator's shadow reduces the amount of radiation reaching the portion of the resist that is in the shadow. The radiation dose on the resist in the shadow is more than the dose at the masked areas of the resist but less than the dose at the unmasked regions of the resist. The attenuators in the mask test area are each of a known and different size, i.e., they are chosen to attenuate different amounts of radiation. Instead of using attenuators of different sizes, attenuation could be accomplished other ways, e.g., using attenuators of the same size but made of materials with different attenuating properties.

As radiation passes through the mask test area, each attenuator creates a separate shadow within an area on the resist called a test field. Each of these shadows occurs at a place called a resist test field location. Each of the attenuators attenuates the radiation passing through it by a different amount so that the resist test field location it exposes receives an attenuated radiation dose different than that at the other locations. In other words, radiation passing through the multiple attenuators on the mask test area creates a number of separate resist test field locations on the resist test field each having a different level of radiation exposure. Consequentially, after irradiation, the resist test field encompasses a pattern of resist test field locations each with a different level of radiation exposure. The pattern of radiation exposure created in the resist test field is called a test field exposure pattern.

The exposure dose of each resist test field location varies in specific increments between (but not including) no exposure and full exposure. The different exposure level at each location causes each location to develop at a different rate than the other locations during the developing step. This is because the time the developer takes to clear each resist test field location depends on how high a radiation dose that location received. Therefore, as the developing proceeds, the resist is totally removed from (clears) one test field location then another in a sequence determined by the dose each location received. As this happens, a changing test field pattern can be observed with a microscope.

This optically observable test field pattern is directly related to the stage of development of the entire resist. By correlating a specific test field pattern to the desired developing endpoint, the development endpoint of the entire resist can be determine solely by optically monitoring the test field while the resist develops. When the correlated test field pattern appears, the desired endpoint has been reached.

The present method, can use visual observation with a general purpose optical microscope, detects the endpoint of the developing process without removing the workpiece from the developing step. (Other optical monitoring techniques may be used as well.) Using this method, precise linewidths between 0.1 and 0.25 microns can be produced efficiently and quickly. Linewidths produced by the present method are ten to 30 times smaller than the known state of the art can produce. In principle, the present invention could produce linewidths even smaller than this, perhaps as low as 500 angstrom. In fact, the only limit appears to be the linewidth printed (exposed) on the resist.

DETAILED DESCRIPTION OF THE INVENTION

Lithographic processes, which play an important role in the manufacturing of integrated circuit (IC) devices and masks, create patterns of a resist on a substrate layer. These processes typically involve: depositing of an energy sensitive resist layer on a substrate; passing some sort of radiation energy (e.g. light, E beam, or X-rays) through a mask to irradiate selected parts of the resist; and placing the resist in a developing agent which selectively removes some of the resist to create the pattern of resist which remains on the substrate.

The resist, has some property, i.e., solubility, which changes after being irradiated. Some resists, called positive resists, increase solubility (dissolve faster in a development bath) with increased radiation dose. Other resists, called negative resists, decrease solubility (dissolve slower in a development bath) with increased radiation dose. While resist materials are commonly used in lithographic processes, any sacrificial coating material (SCM) is within the scope of the present invention. SCM's, which include resists, change some property upon exposure to radiation and can later be partially removed from a substrate by exploiting this changed property.

The mask has a predetermined pattern which corresponds to the final resist pattern desired on the substrate. Parts of the mask pattern permit radiant energy to pass unrestricted or nearly unrestricted through the mask. The energy passing through the mask irradiates selected unmasked areas of the resist at the same or nearly the same dose level as given by the radiation source. Other parts of the mask, opaque to the radiation, block passage of or substantially attenuate radiant energy. Blocking or substantially attenuating the radiation leaves other masked areas on the resist either unexposed or exposed at very low doses.

Radiant energy, incident on the resist, exposes the resist. Any type of radiant energy can be used as long as the energy exposure changes a property of the resist and a developing agent can later exploit this property change. The prior art typically uses light energy, X-rays, E beam, and ion beam.

Developing processes comprise wet bath etching and dry etching (including reactive ion plasma etching). In the developing process, a developing agent creates patterns in the resist by removing either the unmasked, exposed part of the resist or the masked, unexposed (under exposed) part of the resist from the substrate. Specifically, in bath developing processes, the agent typically dissolves the resist.

The endpoint of the developing process can be defined as the point in the resist development when a predicted linewidth is attained. This is often the point when the developing agent first clears the resist in an area by etching through the resist to reach the underlying substrate, i.e., the first clear point. However, for purposes of the present invention, the development endpoint occurs a certain, defined time after the developing agent first clears the resist.

The present invention can predict linewidth, i.e., the width of the resist lines, not just at one point during development but throughout the entire development process. This is achieved by correlating each of a number of specific test field patterns with a corresponding linewidth. As the development proceeds, the linewidth narrows in direct relation to the changing pattern in the developing test field. As the developing step proceeds, specific, progressive test field patterns, corresponding to progressively smaller linewidths, appear in the changing test field. In other words, a range of linewidths can be predicted by visually monitoring the test field through a microscope. Because the present method can predict linewidths at many times during the developing process, the method is said to monitor the linewidths in real time.

The present invention accomplishes this real time linewidth monitoring despite varying factors which affect linewidth such as type of resist, resist energy exposure, resist developing time, mask line width, and resist processing parameters. When the linewidth reaches a selected width (endpoint), the development is terminated. Using this real time monitoring, the present method can produce very narrow linewidths within very tight tolerances. Narrow line widths are desirable in semiconductor technology because they permit denser component packing.

Figure 1:
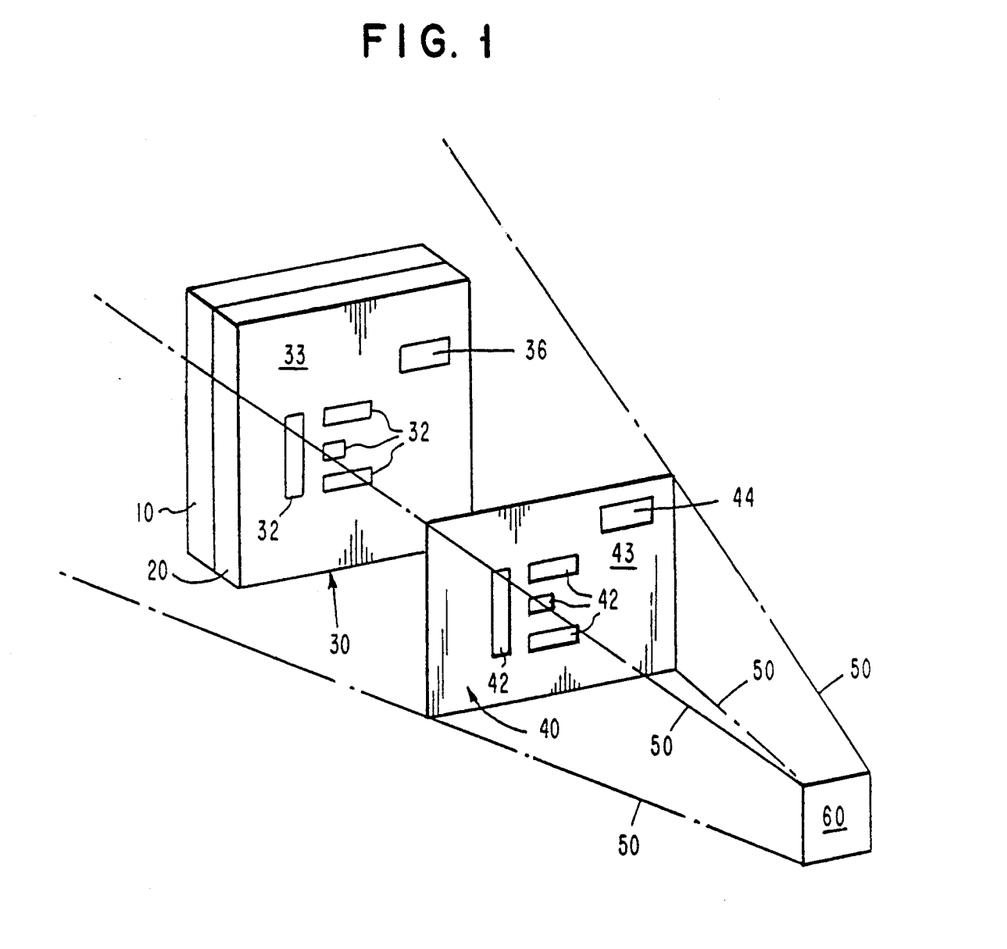
FIG. 1 shows X-rays from a source passing though a mask and impinging on a resist covered substrate. The resist test field and the mask test area are also shown.

FIG. 1 shows the irradiation step of the present invention. A X-ray 50 emits from a X-ray source 60 and passes through a mask 40. The X-ray 50 impinges on a resist 20 which is a layer on a substrate 10. The surface of the entire resist area 30 includes an unmasked, exposed portion 32; a masked, unexposed portion 33; and a test field 36.

The substrate 10 can be material on which a fine lined pattern is to be formed. However, the substrate surface, on which the resist attaches, can not be made of a material which would deteriorate during the X-ray irradiation or resist development process. Typical substrate 10 materials include metal, glass, or silicon. Substrates 10 with fine line, high resolution patterns are used to make: disc drive circuits, semiconductor circuits, semiconductor circuit masks, micromachine parts, and any other product made by transfer of a fine line pattern from a mask to a substrate. The preferred embodiment of this invention used a silicon wafer as a substrate to make a semiconductor circuit.

The resist 20 can be any X-ray sensitive material which adheres to a substrate 10. Upon X-ray exposure, a property of the resist changes. The developing step exploits this property change.

The present method applies to both positive and negative resists 20. However, the preferred embodiment uses a positive resist because, in general, positive resists are more sensitive, i.e., the positive resist develops the pattern linewidths faster. In particular, the preferred embodiment used novolak (i.e, a novolak-based) resist 20 to coat the silicon wafer substrate 10. Novolak is a generic name for a class of resist material. It has good developing characteristics and holds up well to many after development processes. Novolak is very well known in the industry. Chemically Amplified resists, also well known in the art, are also within the scope of this invention.

The mask 40 is situated between the X-ray source 60 and the resist 20. The mask 40 has open or unmasked areas 42 that freely pass the X-ray 50 energy with no or substantially no attenuation. Other masked areas 43 of the mask 40 completely or nearly completely block the passage of the X-ray 50. The unmasked areas 42 permit the X-rays 50 to impinge on the resist 20 at selected irradiated areas 32 of the resist 20. The masked areas 43 of the mask 40 shade areas 33 of the resist 20 causing them to be unexposed or substantially under exposed to the X-ray 50.

In the preferred embodiment, the mask 40 comprises a membrane of silicon about 2 microns thick. The masked area 43 of this mask 40 is formed by a surface layer of gold about 0.6 microns thick. The gold layer acts as a X-ray 50 absorber and prevents about 90% of the X-ray energy from reaching the resist 20. The open or unmasked areas 42 of this mask 40 are devoid of any surface layer. Masks like this are well known in the lithographic arts and any comparable mask would serve the purposes of this invention.

X-ray sources 60 suitable for the purposes of this invention are very common in the art. Some, called synchrotrons, are commonly used as high energy X-ray sources in physics experiments. Others, as common as those found in a dentist's office, could also be used as long as they could provide the correct wavelength of X-ray.

The X-ray 50 must have a high enough energy so that the X-ray attenuators discussed below do not become opaque. Typically these X-rays 50 fall in the range between 2 angstroms and 100 angstroms in wavelength. The more preferable wavelength range is 2 to 15 angstroms. The preferred embodiment used a X-ray 50 between 9 angstroms and 10 angstroms in wavelength.

The amount of time that the X-ray is turned on is determined by the exposure time required for the resist 20. The more sensitive the resist to the X-ray, the less time the X-ray is turned on. The resist used in the preferred embodiment was exposed for about 60 seconds. Some resists may have higher exposure times. Resists are known with exposure times as low as one second. All these resists are within the contemplation of this invention.

Figure 2:
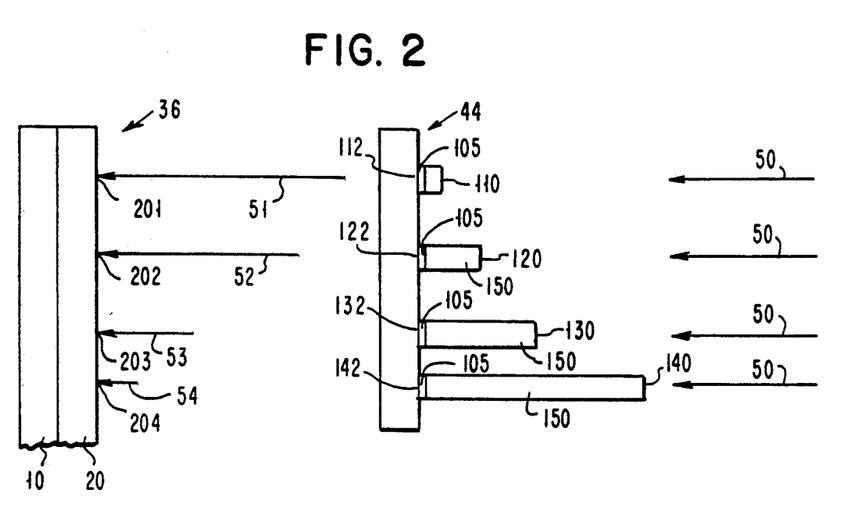
FIG. 2 shows radiation energy passing through a mask test area, attenuated by various attenuators and impinging at determined resist test field locations.

FIG. 1 shows a test field 36 on the resist 20. As the X-ray 50 passes through the mask 43, several locations on the test field 36 are each exposed to a different dose of radiation. These test field locations, 201 through 204 in FIG. 2, are each associated with an attenuator, (110, 120, 130, and 140 in FIG. 2), which attenuates the X-ray 50 before it impinges on the resist test field locations (201 through 204). These attenuators are located on a mask test area 44, an unmasked area of the mask, which is shown in FIG. 1. The attenuators in the mask test area 44 vary in size so that each test field location receives a different radiation exposure. Note that in alternative preferred embodiments there may be more than one mask test area 44 each having one or more test field locations associated with an attenuator.

FIG. 2 shows how the test field 36 is created by the X-ray 50 passing through the mask test area 44. An X-ray attenuating material 150 is deposited on the unmasked mask test area 44 at a plurality of locations represented by locations 112, 122, 132, and 142. The attenuating material 150 is attached (or naturally sticks) to the mask test area 44 with an adhesive type substance 105. Predetermined, but different, thicknesses (110, 120, 130, 140) of attenuating material 150 are attached to each respective location (112, 122, 132, and 142) on the mask test area 44. As the X-rays 50 pass through the mask test area 44, those rays passing through attenuating material 150 are attenuated by an amount related to how much attenuating material 150 the X-rays 50 pass through. Therefore, when the attenuated X-rays (51, 52, 53, and 54) impinge on the resist 20 at their respective locations (201, 202, 203, and 204) they expose each of those resist areas (201 through 204) to different radiation dose levels. For example, the dose level at resist location 201 from impinging X-ray 51 is larger than the dose level at resist location 204 from impinging X-ray 54. In this case, X-ray 50 was attenuated relatively less by the comparatively smaller amount 110 of attenuating material 150 at mask test area location 112 and the X-ray 50 was attenuated relatively more by the comparatively larger amount 140 of attenuating material 150 at mask test are a location 142. In essence, the attenuating material 150 at a particular location on the mask test area 44 puts the corresponding location on the resist 20 in a shadow. The more attenuating material at the location (112, 122, 132, 142) on the mask test area 44, the darker (less dose) the shadow on the resist 20.

Any X-ray attenuating material 150 could be used to accomplish the purposes of this invention if it can be attached to the mask 40, can be placed in desired locations (112, 122, 132, 142), and can be put in those locations in desired amounts (110, 120, 130, 140). For an attenuating material, the preferred embodiment uses polystyrene spheres of various, calibrated, known, and precise diameters attached to the mask test area 44.

Figure 3:
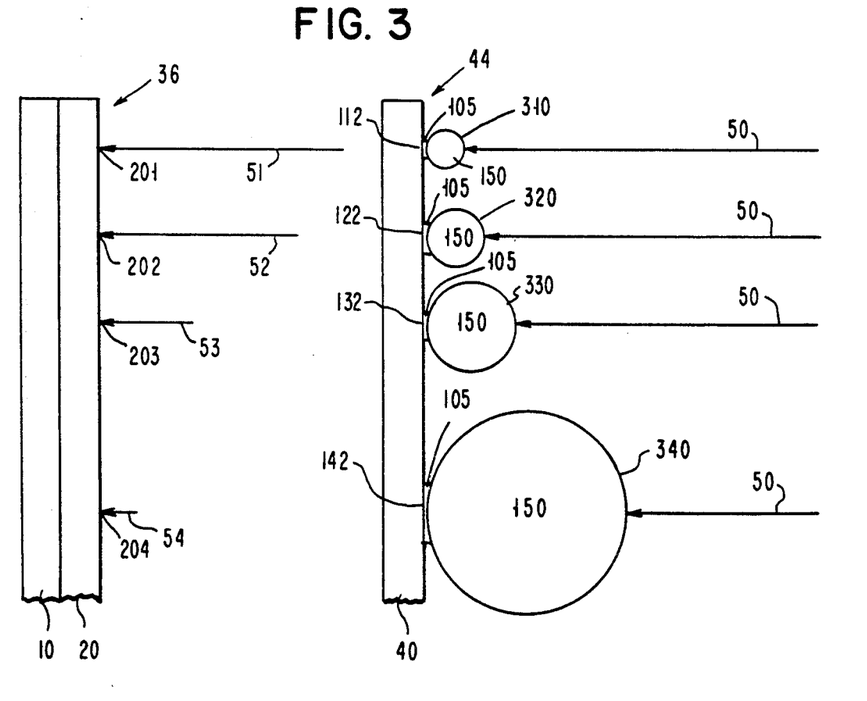
FIG. 3 shows the preferred embodiment of FIG. 2 which uses polystyrene spheres of a known size as attenuators.

The polystyrene spheres, shown in FIG. 3, are commercially available. The spheres are available in discrete sizes from 0.1 um to 40.0 um. Each sphere size came in a suspension of an aqueous solution provided by Duke Scientific under a label entitled Certified Particle-Size Standards, NBS/BCR Tracable.

As shown in FIG. 3, a sphere attenuator of a certain size (310, 320, 330, and 340) is located on each attenuator location (112, 122, 132, and 142) in the mask test area 44. These spheres perform the exact function as in FIG. 2, i.e., they create different X-ray dose levels (X-rays 51 through 54) at respective locations (201 through 204) on the resist 20. Naturally, since the biggest sphere 340 has the most X-ray attenuating material 150, it attenuates X-ray 50 the most causing the lowest dose level (ray 54) at its resist shadow location 204. The smallest sphere 310 attenuates X-rays 50 least causing the highest attenuated dose level (ray 51) at its resist shadow location 201. Note that in the preferred embodiment, there is not one but a plurality of spheres of the same size at each attenuator location (112, 122, 132, and 142) in the mask test area 44.

In order to create the mask test area 44, the X-ray attenuating material (polystyrene spheres 350) has to be placed in known attenuator locations (e.g. 112, 122, 132, 142) on the mask test area 44. See FIG. 4. To accomplish this, a cover 450 is placed (lines 405) on all or a large portion of the mask 40. The cover 450 has an opening 422 which reveals part, i.e., a single attenuator location 122, of the mask test area 44. The rest of the mask test area is covered by the cover 450. Once the mask and mask test area (except one attenuator location 122) are covered, a plurality of polystyrene spheres 350 of a particular size are applied to the uncovered attenuator location 122 on the mask test area 44. Spheres 350 of identical, discrete sizes are commercially available in suspensions of an aerosol solution 460. The aerosol solution, containing spheres of a selected size, is typically applied to the masked test area attenuator location 122 from a standard container 470. The cover 450 prevents the aerosol solution 460 of spheres from contacting any area of the mask except the particular attenuator location 122. The result is a plurality of spheres of a selected size are applied to the mask test area at one chosen attenuator location.

An aqueous suspension of spheres is sprayed through a fine tipped needle by using compressed air as motive pressure. Other ways of applying sphere suspensions such as wiping, painting, or pouring work as well. Any method of applying the suspension of one sphere size to a particular attenuator location of a test area is within the contemplation of this invention.

Figure 4:
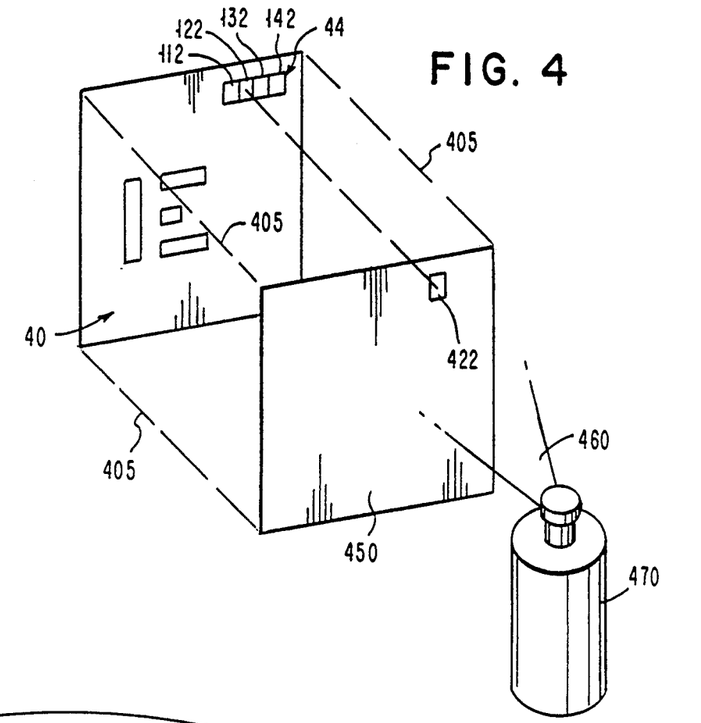
FIG. 4 shows an aerosol of polystyrene spheres being applied to specific locations on the mask test area.

After the sphere aerosol 460 is applied, the cover 450 is removed and the liquid in the aerosol 460 is allowed to dry from the attenuator location 122 of the mask test area. Upon drying, some material 105 in the aerosol 460, unknown to the inventors, fastens the spheres 320 of a particular size to the chosen location 122 on the mask test area 44. This material 105 may be a surfactant added to the aerosol 460 by the manufacturer to prevent the spheres from clumping.

This same procedure is repeated using alternate covers 450 that expose different, selected attenuator locations (112, 132, and 142) in the mask test area 44. On each attenuator location, a plurality of spheres of identical and known size is applied. Each attenuator location has spheres of a size different than those on any other attenuator location. Attenuator locations are added to the mask test area until the desired number of attenuator (sphere) sizes are attached to their respective, individual locations (see 112, 122, 132, and 142 in FIG. 3) on the mask test area 44.

Another preferred embodiment of this invention uses varying thicknesses of material (e.g. carbon or metals like aluminum, tungsten, and gold) as attenuators in the mask test area 44. The thickness of these attenuators (110, 120, 130, and 140) would vary as shown in FIG. 2. Gold attenuators are preferred and would include gold studs, dots, and pads of varying thickness.

In order to create the mask test area 44 using these materials as an attenuators, the X-ray attenuating material is deposited in known attenuator locations (e.g., 112, 122, 132, 142) on the mask test area 44. The material is deposited using a well known process called Focused Ion Beam (FIB) deposition. Since the time that the ion beam is depositing material is correlated to the thickness of the material depositions, the deposition thicknesses can be varied by controlling the ion beam deposition time. Using this process, very accurate thicknesses of material can be deposited. The FIB process can deposit any material that has a suitable adsorbing vapor, in thicknesses from a monolayer to 10's of microns. (See "X-Ray Mask Repair with Focussed Ion Beams", A. Wagner, J. P. Levin, J. L. Mauer, P. G. Blauner, S. J. Kirch, and P. Longo, Journal of Vacuum Science and Technology, B 8(6), November/December, 1990, page 1557).

The material (gold) attenuators of varying thicknesses which are deposited in the attenuator locations serve the same purpose as the polystyrene spheres. Thicker material (gold) deposits absorb more X-ray radiation than thinner deposits do. Therefore, by varying the material (gold) thickness on the attenuator locations on the mask test area, the dose of X-rays penetrating the test area create different X-ray dose levels at respective locations on the resist. The thickness of the material (gold) attenuators can be calibrated, just as the polystyrene spheres are, to create the desired graduated dose levels on the exposed resist.

FIB deposition is a versatile and fast method to accurately position attenuators on the mask test area. Further, since FIB deposition is used in repairing masks (an often necessary step in mask fabrication), the material (gold) attenuators can be placed on the mask during a scheduled, "on-line" repair step. Depositing the attenuators in this way reduces the handling of the mask and helps reduce mask contamination from foreign material.

Once the mask with a mask test area is made, the mask is interposed between a radiation source 60 and a resist 20. As shown in FIG. 1, the radiation 50 from the source 60 passes through the unmasked portions of the mask 42 and is blocked or substantially attenuated by the masked portions 43 of the mask 40. This process creates an exposure pattern on the resist 32 corresponding to the unmasked pattern on the mask 42. In addition, radiation passing through each attenuator on the mask test area 44 is attenuated by an amount which depends on the size (or other attenuating properties) of the attenuator in each mask test field attenuator location. In the irradiation step, the attenuators attenuate the radiation by different, graduated amounts. The different levels of attenuated radiation (51 through 54 in FIG. 2) then create a graduated exposure pattern on the resist test field 36 with discrete exposure levels between no exposure and full exposure.

The number of attenuator (sphere 350) sizes and therefore the number of attenuator locations (for example 112, 122, 132, and 142 in FIG. 2) on the mask test area 44 is determined by how tight the tolerances of linewidth are. The more different attenuator sizes (110, 120, 130 and 140 in FIG. 2) at respective attenuator locations (112, 122, 132, and 142), the better the present method can control linewidth and linewidth tolerances. (See below.)

Since each gradation of radiation exposure in the resist test area 36 is created by an attenuator location, increasing the number of attenuator locations, each with an attenuator of a different size, will improve linewidth control produced by the present method. Unfortunately, as the number of attenuator sizes and attenuator locations increases, fabrication of the mask test area 44 becomes more difficult. In the preferred embodiment, two sphere sizes, 2 and 4 micrometers were used at two separate attenuator locations on the mask test area 44.

Figure 5:
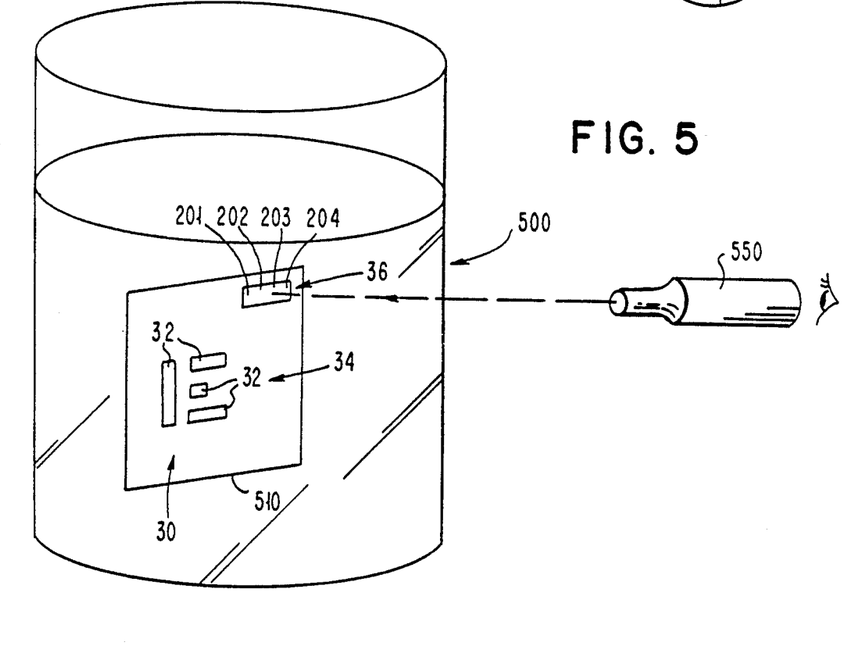
FIG. 5 shows observation of the changing test field pattern while the resist covered substrate is developing.

FIG. 5 shows the resist 20 covered substrate 10, i.e., wafer 510, during the development process. The preferred embodiment uses a static tank of developer as a bath suitable to develop the novolak resist. However, the present method could detect development endpoint in a variety of developing processes including spray developing techniques and plasma etching.

Figure 6:
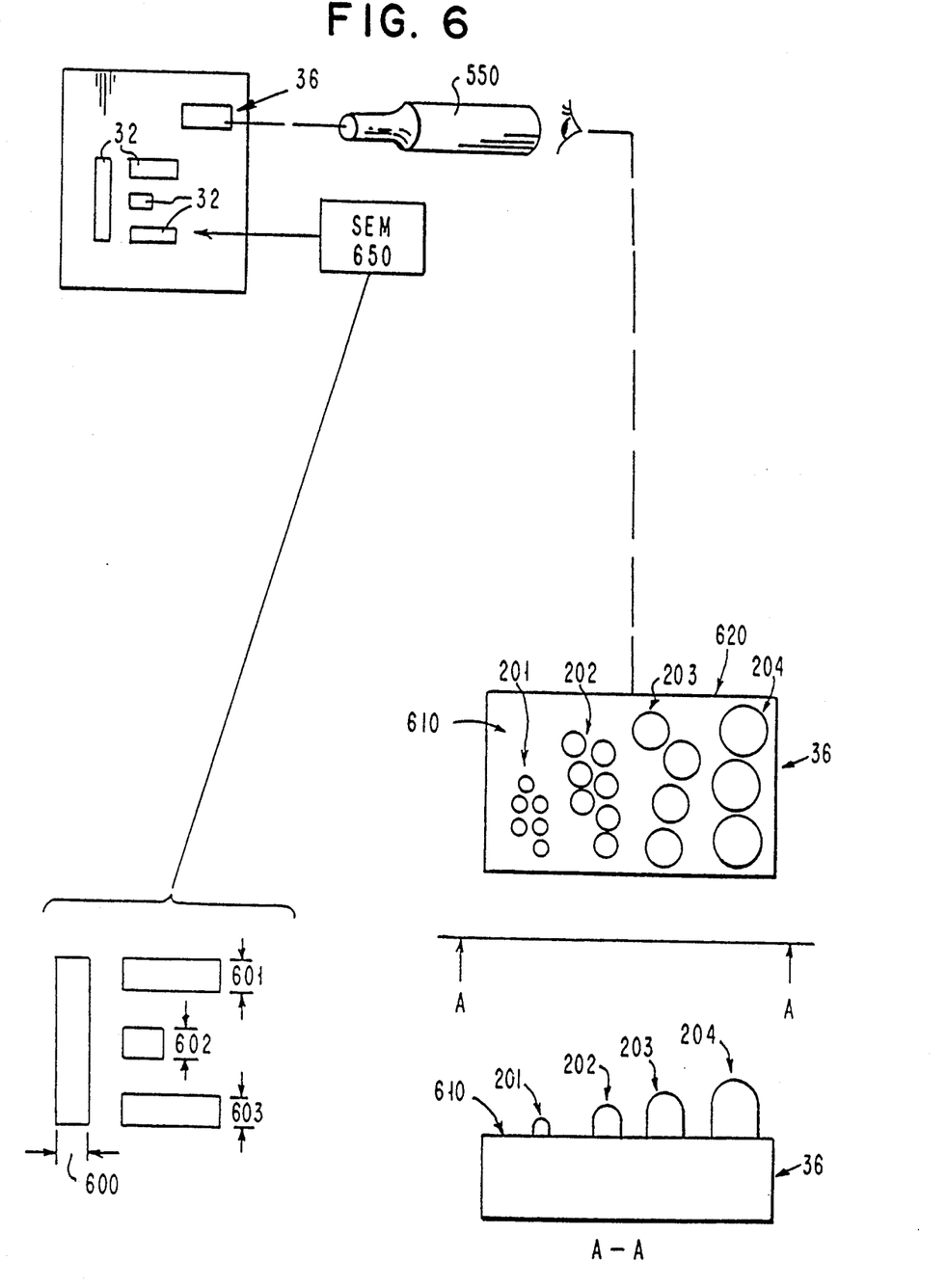
FIG. 6 shows the correlation between the visually observable test field pattern and the Scanning Electron Microscope (SEM) measured linewidths.

During the developing process, the present invention can determine pattern linewidth by observing the changing patterns on the resist test field. As shown in FIGS. 5 and 6, the resist test field 36 is observed optically during the developing step using a microscope 550. The preferred embodiment uses an Olympus microscope of 25× power. Any equivalent general purpose microscope will enable the invention.

The changing patterns of resist on the test field indicate how far the development process has progressed. An observable test field pattern first appears when there is a first clear. First clear is the time when the fastest developing resist 20 (in the preferred embodiment the most soluble) is removed completely from the substrate 10. Since the preferred embodiment uses a positive resist, the resist 20 with the highest radiation dose will clear fastest. This can be observed, among other places, on the part of the test field 36 of the resist 20 which received X-rays 50 that were unattenuated. This is shown in FIG. 6 as area 610 which surrounds test field 36 locations 201 through 204. These locations received the attenuated X-ray doses (rays 51 through 54 shown in FIGS. 2 and 3).

After first clear, the resist location with the largest dose (smallest sphere) 201 clears resist faster than the other resist locations. Resist 20 deposits in this highest attenuated dose test field location 201 etch away faster than the resist 20 deposits in lower dose areas (202 through 204). The same can be said for the area with the next highest dose level 202 with respect to the areas with lower dose levels (203 and 204). Thus as development progresses, the resist at each test field location that received attenuated X-rays (201 through 204) continues to dissolve or clears away sequentially depending on the time the substrate is in the developing step. This sequential resist clearing creates an observable, changing pattern in the test field 36 which is related to how far the developing has progressed on the substrate resist.

Since the resist on the in-situ test field is exposed to the same developing process as the rest of the resist on the substrate, the changing test field pattern (620 in FIG. 6) also correlates to the how much the resist pattern linewidths have developed. Therefore, by matching or correlating the pattern linewidths to the changing test field pattern, the present invention can predict the resist pattern linewidths during the developing step even after first clear. (Usually the end point development takes between 20% and 100% more time than first clear time.) Being able to determine the linewidths in real time during development after the resist first clears gives the present invention distinct advantage, i.e., it can determine the endpoint to accurately produce linewidths smaller than those produced at first clear. Furthermore, by increasing the number of test field locations more gradations of predicted linewidths are possible which enable linewidths to be produced within tighter and tighter tolerances.

Correlating the test field pattern 620 to linewidth is accomplished, as shown in FIG. 6, by measuring line widths 600 through 603 with a Scanning Electron Microscope (SEM) 650 at various times after first clear in the developing step. These SEM linewidths 600 through 603 are then matched or correlated to the optically observed pattern 620 in the test field 36 at that time. During the developing step, future workpieces with a test field created by the same mask will exhibit the same optically observed pattern 620 when future pattern linewidths (600 through 603) are the same as those of the original workpiece when measured by the SEM. In other words, when the correlated pattern 620 appears in the test field 36 during the developing step of a future workpiece, a known pattern of linewidths (600 through 603) has been produced.

Once the correlation procedure is finished, application of the method is simple. As an exposed wafer develops, the pattern is observed through a microscope. When the pattern in the test field 36 matches the known correlated test field pattern 620, the development endpoint has been reached and the linewidths on the wafer are the desired width. At this point the resist covered substrate is removed from the development process. Note that other optical monitoring techniques known in the art can also be used to observe the pattern changes.

Correlating a desired pattern linewidths to a test field pattern is initially accomplished by trial and error. Sometime after first clear in the developing process, the substrate (and test area) is removed from the developing step and the linewidths are measured by a SEM. If the line width is wider than desired, more development time is needed and the associated test field pattern 620 indicates too little development time. Thus more resist has to be etched, i.e., more attenuated dose resist test field locations (201 through 204) have to be cleared of resist in development before the endpoint is reached. If the SEM measured line width is narrower than desired, there was too much development time and the pattern 620 associated with this linewidth has too much resist cleared, i.e., too many attenuated dose resist test field locations cleared. Development of wafers is repeated until the linewidths 600 through 603 within the desired tolerance are obtained. Once this happens, the test field pattern 620 is recorded on a graph, table or other recording device. This completes the correlation of the test field pattern to a linewidth. The recorded test field pattern correlates to the development endpoint which yields the desired submicron linewidth resist pattern on the substrate.

This method often determines a test field pattern which correlates to pattern linewidth within acceptable tolerances. Usually, the desired point is chosen between the time one location clears on the test field and another location has not cleared. However, if this method produces linewidths outside of acceptable tolerances, the method can be adjusted to narrow the nominal mean linewidth variation by adding more exposure locations on the test field.

Mean linewidth error can be decreased by adding test field locations. Each test field location has an exposure level which causes it to clear during development at a point corresponding to a different linewidth, i.e., endpoint. Therefore, if the number of resist test area locations (gradations of exposure) is increased, the number of endpoints associated with a precise resist pattern linewidth will also increase. By adding locations which clear during developing when the pattern linewidths are closer (larger and/or smaller) to the desired linewidth, a development endpoint can be determined closer to one which produces the desired linewidth. In other words, the more gradations of radiation exposure in the resist test area, the smaller the linewidth tolerances can become. Placing more different sized attenuators on added attenuator locations on mask test area 44 will create more gradations of exposure levels on the resist test area 36 during the radiation step.

In the preferred embodiment, two sizes of uniform calibrated polystyrene spheres were used. The spheres of 2 and 4 microns respectively were placed on the mask test field. The novolak resist covered substrate was irradiated and developed. A SEM was used to measure linewidth at the time the resist cleared at each dose level location on the resist test field. The measured linewidth was 0.49 microns when the area under the 2 micron spheres first cleared. As development continued, the linewidth became 0.38 microns when the area under the 4 micron spheres first cleared. Using this method to produce lines nominally 0.5 microns wide, produced lines which measured 0.54 microns.

We claim:

1. A method for determining development endpoint of a sacrificial coating material (SCM) comprising the steps of:

a. exposing simultaneously three or more locations on the SCM to different levels of radiation by passing a radiation beam through a mask having one or more radiation attenuators;

b. developing the SCM;

c. observing the SCM at specific locations form a changing pattern during development; and d. terminating the development when a pattern corresponding to a desired development endpoint appears.

2. A method, of claim 1, the sacrificial coating material being a resist.

3. A method, of claim 2, the radiation being X-ray radiation.

4. A method, of claim 3, each attenuator being a plurality of polystyrene spheres of known size.

5. A method of determining endpoint development of a resist exposed to radiation passing through a mask comprising the steps of:

a. exposing an unmasked area of the resist directly to the radiation which passes through a plurality of mask openings, the unmasked area having a high radiation dose level;

b. blocking exposure of the radiation to a masked area of the resist with the opaque part of the mask, the masked area receiving no effective radiation dose level;

c. exposing a test field on the resist to the radiation passing through one or more radiation attenuating elements to create an exposure pattern on the test field having one or more radiation dose levels, each dose level having a lower dose level than the unmasked area but having a greater dose level than the masked area;

d. developing simultaneously the unmasked area, masked area, and test field;

e. observing a changing resist pattern in the test field during the developing process;

f. comparing the pattern in the test field with a known resist pattern which correlates to the desired endpoint; and g. removing the resist from the developing process when the observed pattern in the test field is the same as the known correlated resist pattern.

6. A radiation exposure pattern on a sacrificial coating material comprising:

an area exposed to a high dose of radiation;

one or more areas exposed to an attenuated dose of radiation;

an area effectively unexposed to a dose of radiation;

the attenuated areas being exposed to a level of radiation between the high dose and the unexposed dose.

7. A method of lithography to detect development endpoint of a resist covered substrate comprising the steps of:

a. passing radiation through a plurality of openings in a mask to impinge on unmasked portions of the resist, the unmasked resist portions receiving a high radiation dose level;

b. blocking radiation to a masked portion of the resist with an opaque part of the mask, the masked resist portion receiving no effective radiation dose level;

c. exposing a test field of the resist to the radiation passing radiation through one or more radiation attenuators on the mask, radiation passing through each of the attenuators exposing a location on a resist test field on the resist to a radiation level greater than the level in the masked resist portion but less than in the unmasked resist portion;

d. developing the resist at least long enough for the resist to clear from some parts of the substrate, the resist remaining on the substrate forming a resist pattern comprising lines with linewidths and the resist test field having a changing pattern of locations cleared of resist and locations with resist remaining;

e. observing the changing test field resist pattern during the developing step; and f. removing the substrate from the developing step when the changing test field resist pattern matches a known pattern which correlates to the desired endpoint.

8. A method, of claim 7, having two or more attenuators, each of which passes radiation to expose a location on the resist test field to a unique radiation level.

9. A method, of claim 7, the resist being a positive resist.

10. A method, as in claim 7, wherein the radiation attenuating elements are polystyrene spheres of known diameter.

11. A method, as in claim 10, wherein the polystyrene spheres are of two diameters, 2 microns and 4 microns.

12. A method, as in claim 7, wherein the test field pattern is observed with microscope.

13. A method of lithography correlating a resist pattern linewidth on a substrate to a resist pattern in a test field comprising the steps of:

a. passing radiation through a plurality of openings in a mask to impinge on unmasked portions of the resist, the unmasked resist portions receiving a high radiation dose level;

b. blocking simultaneously radiation to a masked portion of the resist with an opaque part of the mask, the masked resist portion receiving no effective radiation dose level;

c. exposing simultaneously a test field of the resist to the radiation passing radiation through one or more calibrated radiation attenuators on the mask, each of the attenuators exposing a location on a resist test field on the resist to a radiation level greater than the level in the masked resist portion but less than the level in the unmasked resist portion;

d. developing the resist at least long enough for the resist to clear from some parts of the substrate, the resist remaining on the substrate forming a resist pattern comprising lines with linewidths and the resist test field having a pattern of locations cleared of resist and locations with resist remaining;

e. removing the substrate from the developing process;

f. measuring the resist pattern linewidths on the substrate;

g. observing the test field resist pattern; and h. correlating the observed test field resist pattern to the measured linewidths.

14. A radiation mask for creating radiation exposure patterns on a radiation sensitive material (SCM) having:

a radiation passing portion which passes radiation to expose selected areas on the SCM;

a radiation blocking portion which effectively blocks radiation from impinging on other selected areas on the SCM;

a mask test area being a radiation passing portion with a plurality of radiation attenuating elements which serve to cause the radiation passing through the elements to be attenuated in predictable amounts.

15. A method of making a mask test area on a mask for use in lithography comprising the steps of:
 a. covering all but one first attenuator location on the mask test area with a first cover;
 b. applying an attenuator material to the uncovered attenuator location, the cover preventing the material from being applied to other mask locations;
 c. removing the cover;
 d. covering all but a next attenuator location on the mask test area with a next cover;
 e. applying a next calibrated attenuator material to the uncovered next attenuator location, the next cover preventing material from being applied to other mask locations;
 f. removing the next cover; and
 g. repeating steps d through f until all the desired number of attenuator locations on the mask test area receive an application of attenuator material.

16. A method, of claim 1, where the radiation attenuators are made of carbon or metal.

17. A method, of claim 1, where the radiation attenuators are made of gold.

18. A method, of claim 16, where the carbon or metal is deposited by Focused Ion Beam deposition.

* * * * *